United States Patent [19]
Perkin

[11] Patent Number: 4,734,883
[45] Date of Patent: Mar. 29, 1988

[54] MAGNETIC BUBBLE MEMORY PURGE AND VERIFICATION SYSTEM

[75] Inventor: Bruce C. Perkin, Tujunga, Calif.

[73] Assignee: The Singer Company, Stamford, Conn.

[21] Appl. No.: 732,780

[22] Filed: May 10, 1985

[51] Int. Cl.$^4$ .............................................. G11C 19/08
[52] U.S. Cl. ........................................ 365/1; 365/218
[58] Field of Search .................... 365/1, 2, 27, 28, 218

[56] References Cited

U.S. PATENT DOCUMENTS

| | | | |
|---|---|---|---|
| 3,460,116 | 8/1969 | Bobeck et al. | 365/21 |
| 3,503,054 | 3/1970 | Bobeck et al. | 365/28 |
| 3,602,911 | 8/1971 | Kurtzig | 365/28 |
| 3,711,841 | 1/1973 | Geusic et al. | 365/28 |
| 3,714,640 | 1/1973 | Bobeck | 365/27 |
| 3,744,042 | 7/1973 | Cutler et al. | 365/27 |
| 4,068,219 | 1/1978 | Chow | 365/27 |
| 4,400,809 | 8/1983 | Whitinger | 365/1 |
| 4,675,513 | 6/1987 | Kuze | 365/201 |

Primary Examiner—James W. Moffitt
Attorney, Agent, or Firm—David L. Davis

[57] ABSTRACT

An arrangement for purging a magnetic bubble memory and providing a visible purge verification utilizes the thermal compensation Z-axis coil for providing a purge field. A power supply, purge switch and current sensitive circuit interrupter are connected across the thermal compensation coil. When the switch is closed, a surge of relatively high current many times greater than that required for thermal compensation is applied to the coil. Accordingly, the bubbles in the memory will completely disappear. The circuit interrupter is used to halt the purge current once it exceeds the required purge value. This protects the thermal compensation winding and also provides a visual verification that a purge pulse has occurred.

2 Claims, 2 Drawing Figures

MAGNETIC BUBBLE MEMORY PURGE AND VERIFICATION SYSTEM

BACKGROUND OF THE INVENTION

This invention relates to magnetic bubble memories and, more particularly, to a system for purging the contents of such a memory and providing a visual verification of the purge.

In recent years, magnetic bubble memories have gained in popularity over other non-volatile storage devices for secure data. This is because, unlike magnetic tapes or discs, no fringe field areas exist in magnetic bubble memories that can be analyzed for previously stored data. In a magnetic bubble memory, a single write pass of all data absolutely removes all previous data.

When using a magnetic bubble memory for secure data, it is sometimes desirable to be able to completely erase, or purge, all of the data from the memory. If the built-in writing circuitry were utilized, the problem exists that the system supporting the bubble memory must be running and continue to run for the entire purge period. With a one megabit bubble memory, approximately ten seconds are required to completely rewrite the memory with bogus data. In an emergency situation, this time may not be available.

It is therefore a primary object of the present invention to provide a substantially instantaneous magnetic bubble memory purge system.

It is a further object of this invention to provide such a purge system with an arrangement for indicating that a purge has successfully been performed.

SUMMARY OF THE INVENTION

The foregoing and additional objects are attained in accordance with the principles of this invention by providing an arrangement for erasing the contents of a magnetic bubble memory comprising a source of electrical power, a coil arranged along the Z-axis of the memory, means for initiating a connection of the power source to the coil to provide coil current sufficient to erase the memory, and means for terminating the connection.

In accordance with an aspect of this invention, the terminating means includes means for providing a visual indication that the connection has been initiated and subsequently terminated.

In accordance with another aspect of this invention, the terminating means includes a current sensitive circuit interrupter.

In accordance with a further aspect of this invention, the thermal compensation coil of the memory is utilized as the purge coil.

BRIEF DESCRIPTION OF THE DRAWINGS

The foregoing will be more readily apparent upon reading the following description in conjunction with the drawings in which like elements in different figures thereof have the same reference character applied thereto and wherein.

DETAILED DESCRIPTION

A magnetic bubble memory typically comprises a magnetic domain film sandwiched between permanent magnets which provide a magnetic bias field to maintain the magnetic domains. This structure may then be surrounded by a shield. Since the magnetic properties of the magnetic domain film are temperature dependent, there is often provided a thermal compensation coil surrounding the shield, which coil is utilized to provide a magnetic field which modulates the permanent magnet bias field in accordance with temperature variations. If the plane of the magnetic domain film is considered the X-Y plane, then the thermal compensation coil may be considered to be along the Z-axis.

If the current in the Z-axis coil is increased beyond the current required for thermal compensation, at some point the magnetic field generated by that coil will be sufficient to cause the magnetic bubbles to completely disappear. This will be substantially instantaneous, on the order of microseconds. It does require a complex operation to reseed and reboot the bubbles, but purging the memory is an emergency procedure making the rework costs worth it. No physical damage will occur and the rework procedure can be performed electronically on automated equipment.

Figure 1:
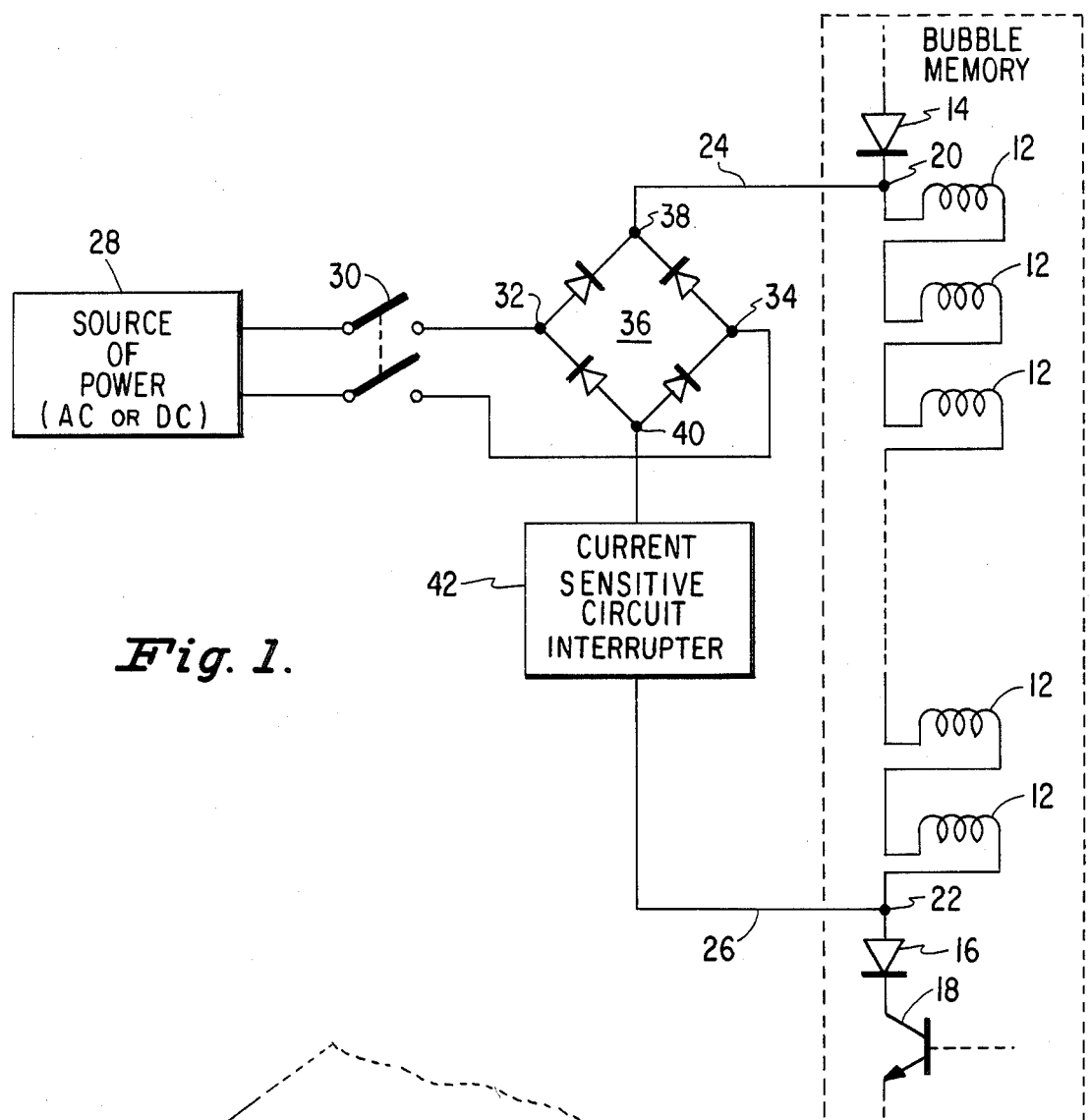
FIG. 1 is an electrical schematic diagram of an illustrative system constructed in accordance with the principles of this invention.

Referring now to FIG. 1, shown therein is illustrative circuitry for instantaneously erasing, or purging, the contents of the bubble memory, designated generally by the reference numeral 10. As part of the memory 10, there may be provided multiple Z-axis thermal compensation windings 12 connected in series. Each of the windings 12 is associated with one bubble memory device within the bubble memory 10. The diodes 14 and 16 and the transistor 18 form a portion of the thermal compensation circuitry, but do not form a portion of the present invention and are not utilized for purging the memory. According to this invention, connections are made at the points 20 and 22 to the compensation coils 12. These connections are brought out of the memory 10 via the leads 24 and 26.

According to this invention, a source of electrical power 28 is provided. This source is separate from the bubble memory power and may be either AC power or DC power. The power output terminals are connected to one side of a normally open double pole single throw switch 30. The other side of the switch 30 is connected to the input terminals 32 and 34 of a diode bridge 36. The output terminal 38 of the diode bridge 36 is connected via the lead 24 to the connection point 20 at one side of the compensation coils 12. The output terminal 40 of the diode bridge 36 is connected to a current sensitive circuit interrupter 42, which may be, for example, either a fuse or a circuit breaker. The other side of the interrupter 42 is connected to a current sensitive connection point 22 at the other side of the compensation coils 12.

The interrupter 42 is chosen to allow current on the order of ten times the thermal compensation current to flow through the coils 12 before opening the circuit. Thus, the interrupter 42 may comprise a one ampere fuse. When it is desired to purge the memory 10, the switch 30 is closed. This initiates the connection of the power source 28 to the coils 12. The diode bridge 36 insures that current may only flow in one direction through the compensation coils 12, no matter what the polarity or type of source 28 is connected to the purge system. This is so that the purge current has the same sense as the compensation current, which insures that excessive current is not required. It is also of the proper sense so that the compensation drive circuitry is not damaged. In any event, the interrupter 42 opens the circuit when the purge current reaches its threshold. This terminates the connection of the power source 28 to the coils 12. However, since the purge is virtually instantaneous, purging is complete by the time the interrupter 42 responds.

Figure 2:
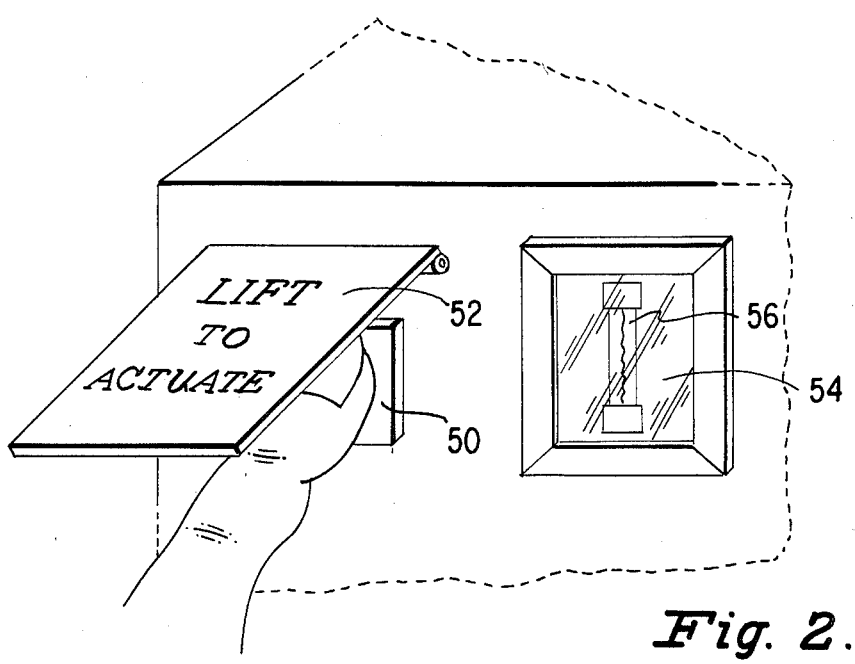
FIG. 2 is a perspective view of a portion of an embodiment of this invention.

It is also desirable to provide a visual indication that the purge operation has successfully been performed. If the interrupter 42 comprises a fuse, then the appearance of the blown fuse provides such an indication. If the interrupter 42 comprises a circuit breaker, then a flag which appears when the circuit breaker is tripped provides the indication. FIG. 2 illustrates how this may be accomplished. The purge switch 30 is connected to an actuator button 50, which is normally covered by a hinged plate 52. When it is desired to purge the memory, the plate 52 is raised and the button 50 is depressed, closing the purge switch 30. In the general vicinity of the switch actuator button 50, there is provided a transparent window 54 through which is visible the fuse 56, or alternatively a circuit breaker. The appearance of a blown fuse or a circuit breaker flag through the window 54 indicates that the purge operation has been successfully completed.

In accordance with this invention, only a relatively short surge of relatively high current is required to purge the memory. In a few milliseconds, the interrupter will terminate the purge. Therefore, any power outlet, vehicle power source or battery pack can be connected to the purge circuit to make it operate. Purging can be performed any place that power is available and it is feasible to provide batteries where it is not available. An example of a battery powered purge application is in the use of removable bubble memory modules. These would normally be programmed at one location and transported to another for use. A battery pack could be provided as a part of the transit case, with battery availability being assured by requiring the module to plug into the battery pack in order to close the carrying case. Another useful application of this purge system is found in airborne applications. An acceleration limit switch could be used to activate the purge in the event of a crash. This switch would operate as a backup to the normal operator influenced switch in the event the operator has no knowledge that a crash is imminent.

Accordingly, there has been disclosed an arrangement for purging the contents of a magnetic bubble memory. It is understood that the above-described embodiment is merely illustrative of the application of the principles of this invention. Numerous other embodiments may be devised by those skilled in the art without departing from the spirit and scope of this invention, as defined by the appended claims. For example, if thermal compensation is not required for a specific memory, then the Z-axis coil could be installed solely for purging the memory. Also, although a double pole single throw switch has been illustrated, it may not be necessary in all applications. Thus, the double pole single throw switch provides electrical isolation while the system is operational, but such isolation is not necessary when the purge system is built into a transit case. Further, although a single overall purge system has been illustrated, this invention may be practiced by providing connections and indicators with only selected groups of bubble devices. Thus, if some bubble groups do not contain sensitive data, these groups need not be purged.

I claim:

1. In combination with a bubble memory having a Z-axis thermal compensation coil, an arrangement for erasing the contents of said memory comprising:
   a source of electrical power having two output terminals;
   means for connecting said terminals to one side of a normally open double pole single throw switch;
   a diode bridge having a pair of input terminals and a pair of output terminals;
   means for connecting the second side of said switch to said diode bridge input terminals;
   means for connecting a first of said diode bridge output terminals to a first end of said coil;
   a current sensitive circuit interrupter;
   means for connecting the second of said diode bridge output terminals to a first side of said interrupter; and
   means for connecting the second side of said interrupter to the second end of said coil.

2. The arrangement according to claim 1 further including means for providing a visible indication of the condition of said interrupter.

* * * * *